United States Patent [19]

Sheen et al.

[11] Patent Number: 5,631,572
[45] Date of Patent: May 20, 1997

[54] PRINTED CIRCUIT BOARD TESTER USING MAGNETIC INDUCTION

[75] Inventors: Timothy W. Sheen, Brighton; Jiann-Neng Chen, Newton; Stephen A. Cohen, Andover; Michael A. Baglino, Sharon; Joseph F. Wrinn, Quincy, all of Mass.

[73] Assignee: Teradyne, Inc., Boston, Mass.

[21] Appl. No.: 227,854

[22] Filed: Apr. 15, 1994

Related U.S. Application Data

[63] Continuation-in-part of Ser. No. 123,145, Sep. 17, 1993.

[51] Int. Cl.$^6$ ........................................ G01R 31/02
[52] U.S. Cl. ........................................ 324/754; 324/95
[58] Field of Search ...................... 324/754, 158.1, 324/73.1, 95, 538, 528, 529, 530, 238, 239, 240; 343/700 MS, 742, 744, 895, 854, 788

[56] References Cited

U.S. PATENT DOCUMENTS

| | | | |
|---|---|---|---|
| 3,719,883 | 3/1973 | Pentecost | 324/51 |
| 3,906,514 | 9/1975 | Phelen | 343/895 |
| 3,925,784 | 12/1975 | Phelan | 343/895 |
| 3,949,407 | 4/1976 | Jaylman et al. | 343/895 |
| 4,186,338 | 1/1980 | Fichtenbaum | 324/521 |
| 4,647,937 | 3/1987 | Hidaka et al. | 343/742 |
| 4,835,538 | 5/1989 | McKenna et al. | 343/700 MS |
| 5,028,866 | 7/1991 | Wiese | 324/95 |
| 5,124,660 | 6/1992 | Cilingiroglu | 324/538 |
| 5,218,294 | 6/1993 | Soiferman | 324/95 |
| 5,243,358 | 9/1993 | Sandford et al. | 343/700 MS |
| 5,254,953 | 10/1993 | Crook et al. | 324/538 |
| 5,424,633 | 6/1995 | Soiferman | 324/158.1 |

FOREIGN PATENT DOCUMENTS

| | | | |
|---|---|---|---|
| 0575061A1 | 12/1993 | European Pat. Off. | |
| WO91/04497 | 4/1991 | WIPO | 31/28 |

Primary Examiner—Vinh P. Nguyen
Attorney, Agent, or Firm—Arnold, White & Durkee

[57] ABSTRACT

An apparatus and method are disclosed for testing connections between printed circuit boards and components mounted thereon. A conductive loop is formed by forward biasing a parasitic diode that is inherently present between an integrated circuit (IC) lead and the ground plane of the IC. A magnetic field is created by an antenna mounted above the component to be tested. When the antenna is energized by an RF source, a voltage is induced in the conductive loop if the loop is continuous, i.e., if all of the connections are properly made. The voltage in the loop is measured and compared to a selected threshold to produce a pass/fail indication. This tester may be implemented as an improvement to a standard type of "bed-of-nails" printed circuit board tester. The antenna may be implemented as an array of spiral loop antennas, with adjacent antennas producing magnetic fields that are 90 degrees out of phase with each other.

29 Claims, 5 Drawing Sheets

PRINTED CIRCUIT BOARD TESTER USING MAGNETIC INDUCTION

This application is a continuation-in-part of Ser. No. 08/123,145, filed Sep. 17, 1993 (pending).

BACKGROUND

1. Field of the Invention

This application relates generally to electronic test equipment and more specifically to equipment for testing populated printed circuit boards for manufacturing defects.

2. Description of the Prior Art

During the manufacture and subsequent handling of printed circuit boards, defects such as unwanted open circuits or short circuits may develop in or between circuit pathways and electronic components. It is necessary to perform automated testing of printed circuit boards both for manufacturing quality control and for maintenance purposes.

Testing printed circuit boards is becoming increasingly difficult and more expensive as the use of surface mount technology increases and as integrated circuits and printed circuit boards become more complex and operate at higher frequencies. Conventional techniques for automated printed circuit board testing involve applying signals through a set of test pins and measuring output signals on other test pins. "Functional testing" can be performed by energizing the printed circuit board, applying a preselected set of input signals, and determining whether the proper output signals are generated by the circuitry on the board being tested. Alternatively, a printed circuit board may be tested on a "bed-of-nails" tester that comprises pins which contact the metallic traces on the printed circuit board being tested so that selected input signals may be applied at various nodes on the printed circuit board, and corresponding output signals can be measured at other nodes on the printed circuit board. Conventional bed-of-nails testing requires that the functionality of the circuits mounted on the board under test be known, so that test routines can be written to isolate the circuitry of interest, to apply input signals to the appropriate nodes, and to generate expected output signals to be received from other nodes.

One alternative printed circuit board testing method is described in U.S. Pat. No. 5,218,294, issued Jun. 8, 1993 to Soiferman. The Soiferman patent disclosed stimulating a printed circuit board through the power and ground lines of the board with an AC signal and then contactlessly measuring the electromagnetic near field distribution proximate the board being tested. The electromagnetic "signature" of the board being tested was compared to the electromagnetic signature of a known good circuit board to determine whether the board under test was defective.

Another approach to printed circuit board testing is disclosed in U.S. Pat. No. 5,124,660, issued on Jun. 23, 1992 to Cilingiroglu. That patent disclosed a system to determine whether input and output leads of a semiconductor component are properly connected to a printed circuit board. The system includes an oscillator which is connected to a metallic electrode placed on top of an integrated circuit package that is mounted on a printed circuit board. A probe pin of a bed-of-nails tester is connected to a current measuring device, and the pin is also connected to a printed circuit board wiring trace that is supposed to be soldered to the component lead being tested. An oscillator signal is capacitively coupled from the metallic electrode on top of the integrated circuit package through the integrated circuit package to the lead being tested. If the lead being tested is properly connected to the printed circuit board, current can be measured in the appropriate trace on the printed circuit board.

The approach described in the Cilingiroglu patent has several deficiencies. First, it can miss hairline fractures in components or in connections because the test signal may capacitively couple across small, but incapacitating, gaps between conductors. Second, it only tests the connection between the pin of a component and the PC board traces, and it does not test any of the intra-component connections, such as between the integrated circuit itself and the pin that extends from the package, which may be caused by a missing or defective bond wire connection. Third, it only tests whether any pin of the component is connected to a node on the PC board, and it does not give any indication of whether the component is properly inserted into the PC board with the correct orientation. Finally, because this approach relies on capacitive coupling between the lead frame of the integrated circuit and the metallic electrode, the presence of a ground plane or a metal heat sink within or above the integrated circuit can prevent reliable results from being obtained.

U.S. Pat. No. 5,254,953 to Crook et al. is owned by the same assignee and similarly relates to a technique for detecting opens using capacitive coupling. In Crook's patent, a signal is introduced to a pin under test through a probe contacting a trace on the printed circuit board. A conductive electrode is placed over the component being tested and connected to a current measuring device. If the part is properly connected to the printed circuit board, the signal is capacitively coupled to the current measuring device. Detection of the coupled signal indicates a good connection between the pin and the printed circuit board.

U.S. Pat. No. 4,829,238, issued May 9, 1989 to Goulette, et al., discloses monitoring electromagnetic emissions from a printed circuit board by energizing the board while it is located adjacent an array of electromagnetic emission measuring probes. A division from that application, U.S. Pat. No. 5,006,788, issued to Goulette, et al. on Apr. 9, 1991. The Goulette patents are directed toward measuring radiating electromagnetic emissions from a circuit board, primarily for the purpose of eliminating or monitoring electromagnetic interference generated by a circuit board or the components mounted thereon. Goulette's approach is not directed toward testing a printed circuit board for manufacturing defects which do not result in interfering levels of electromagnetic radiation. There are numerous other patents, as cited in the Goulette patents, which are directed toward testing printed circuit boards for undesirable radiating emissions.

One other approach to testing for defective connections in a populated printed circuit board is described in U.S. Pat. No. 4,779,041 to Williamson, Jr. That patent describes a testing method in which two probes are connected to printed circuit board traces that are supposed to be connected to leads of an integrated circuit. If those leads are properly connected to the PC board, a current can be injected into one lead, forward biasing a parasitic diode which forms in the chip's substrate between the lead and ground. A second, larger current pulse, is then injected into the second lead. If both leads are connected to the printed circuit board, the second current flow will cause a measurable voltage drop across the inherent resistance of the substrate. Thus, a change in voltage in response to the second current pulse tends to indicate that the component is properly connected to the PC board. This technique relies on the existence of a common impedance in the path to ground from multiple leads in an integrated circuit. Such a common impedance is not always present. When such a common impedance is present, it is usually very low, and relatively high currents must be applied to the circuit to produce a measurable voltage change. Under some circumstances, such high currents can damage sensitive integrated circuit chips.

There is thus a need in the art for a device and method that will determine whether all of the leads of components mounted on a printed circuit board are properly connected (e.g., soldered) to the circuit board. There is a further need in the art for such a device that does not require generation of functional test vectors, and that does not require back-driving or otherwise isolating adjacent components on the PC board. There is a further need for a tester that does not rely on the existence of a common impedance between device leads and ground, that does not require application of undesirably high currents to integrated circuits, and that does not require the circuit board being tested to be functioning or energized while the test is being performed. There is still further need in the art for such a system that can operate with a signal to noise ratio adequate to prevent frequent false readings and that does not require precise and complex fixturing to position the sensors adjacent the board being tested. Also, there is a need for a system that can detect failures even if the components mounted on the PC board contain electromagnetic shielding or if the failure is a hairline fracture.

SUMMARY OF THE INVENTION

The present invention provides solutions to a number of deficiencies in the prior art. It provides an accurate method for detecting defective connections on populated printed circuit boards (hereinafter referred to as "PC boards"). It also provides a tester that can detect faulty connections between a PC board and an integrated circuit chip with EMF (electromagnetic field) shielding. It also provides a tester that can test the continuity of connections within an integrated circuit component that is mounted on a PC board.

The foregoing benefits and others are provided by a tester having, in preferred embodiments, a bed-of-nails fixture adapted to receive a printed circuit board populated with integrated circuit chips. The bed-of-nails fixture connects DC (direct current) bias sources and an RF (radio frequency) voltage sensor to the PC board under test. An antenna for radiating a magnetic field is placed over the PC board. In operation, the DC bias source forward biases so-called "parasitic diodes" that are inherently created as part of the integrated circuit chip. In a correctly assembled board, the forward biased diodes complete conducting loops between selected pins of the integrated circuit component and ground. The antenna, when energized by a radio frequency (RF) source, creates a magnetic field in the vicinity of the chip, which induces RF voltages in the conducting loops. The voltage sensor connected to the board under test through the bed-of-nails test fixture senses these RF voltages and can analyze them to determine if the printed circuit board is correctly assembled, in particular whether a selected terminal on the integrated circuit is connected to the PC board.

According to one embodiment of the invention, the antenna is an array antenna that may cover all or a portion of the PC board being tested. The array antenna is controlled such that, at any given time, only selected antenna elements near selected integrated circuit chips being tested are energized.

In some embodiments, measures are employed to alter the characteristics of the magnetic field to control its penetration into the integrated circuit chip and the printed circuit board. In one embodiment, the signals provided to the antenna array elements are phase shifted. In another embodiment, the antenna is backed by a ground plane, the position of which may be selected to selectively control the shape of the field emitted by the antenna. These and other advantages of the present invention will be further appreciated from the drawings and from the detailed description provided below.

BRIEF DESCRIPTION OF THE DRAWINGS

So that the manner in which the herein described advantages and features of the present invention, as well as others which will become apparent, are attained and can be understood in detail, more particular description of the invention summarized above may be had by reference to the embodiment that is illustrated in the appended drawings, which drawings form a part of this specification.

It is to be noted, however, that the appended drawings illustrate only exemplary embodiments of the invention and are therefore not to be considered limiting of its scope, for the invention may admit to other equally effective embodiments.

DETAILED DESCRIPTION OF PREFERRED EMBODIMENTS

Figure 1:
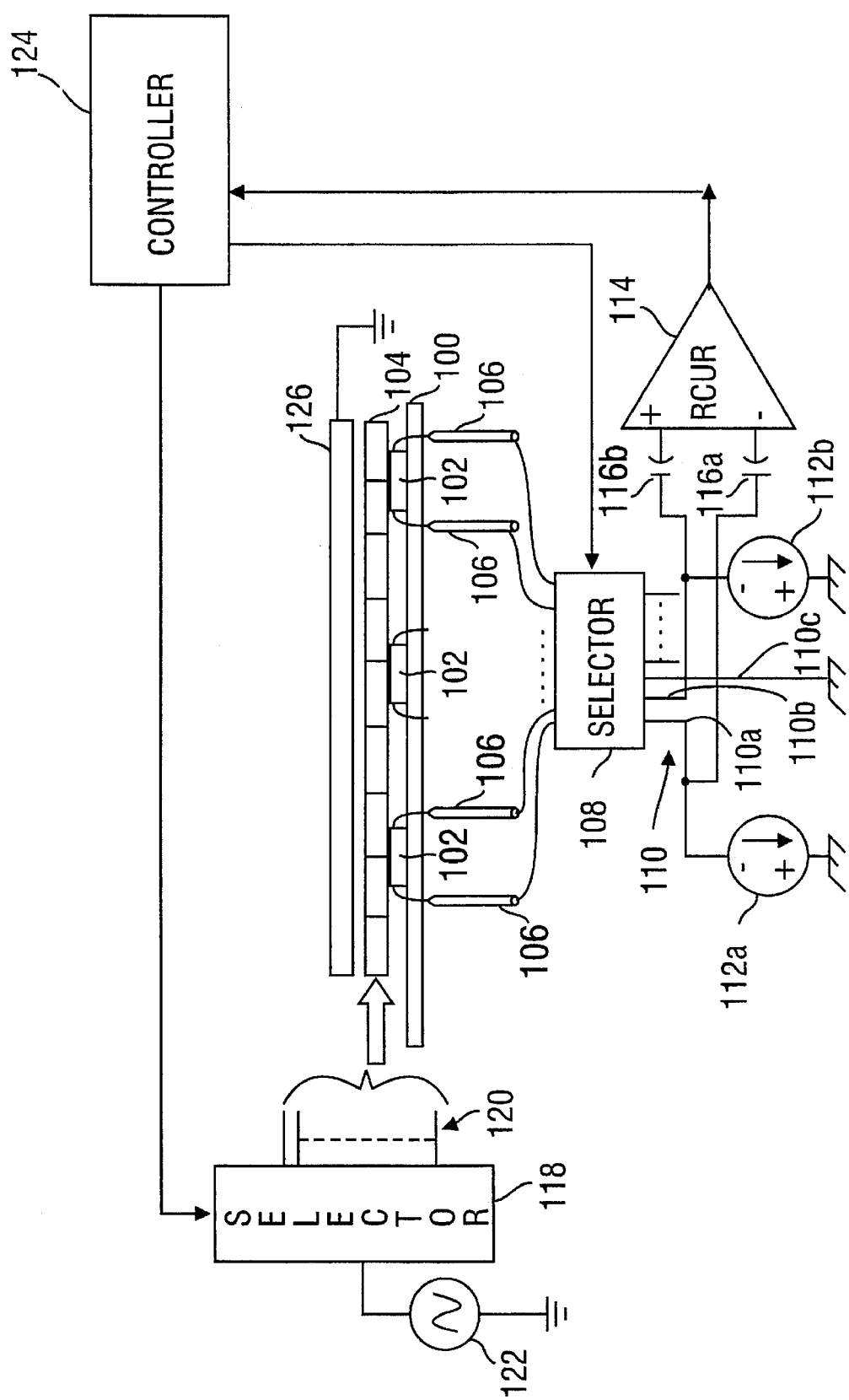
FIG. 1 is a simplified schematic of a tester according to the invention.

FIG. 1 shows a printed circuit board (PCB) 100 being tested according to the invention. PCB 100 is populated with numerous integrated circuit (IC) chips 102. Each of the IC chips 102 contains leads (not numbered) which are, in a correctly assembled board, soldered to conductive traces (not shown) on PCB 100. Connection of components other than integrated circuits may be tested using the principles disclosed herein. For ease of description, however, all such components and IC chips will be referred to herein collectively as "ICs" or "IC chips".

PCB 100 is held in a fixture (not shown) including a "bed-of-nails" 106. As in a conventional tester, PCB 100 is held in contact with the bed-of-nails 106 such that the contact pins (or "nails") make electrical contact with conductive traces (not shown) on PCB 100.

The nails 106 of interest are connected to selector 108. Selector 108 is a collection of switches that can connect selected ones of the nails 106 to any one of a plurality of outputs 110. Here, the outputs 110 are connected to DC bias sources 112A and 112B, ground 110C and a receiver 114.

DC bias sources 112A and 112B are DC current sources, preferably operating in the range of 1 mA to 10 mA. Receiver 114 is a differential analog receiver which senses the difference in voltage at its input terminals. Here, receiver 114 is selected to be sensitive to frequencies in the range produced by RF source 122. For better noise immunity, receiver 114 is preferably tuned and synchronized with RF source 122. Receiver 114 preferably has a sensitivity of at least a few microvolts and can handle signal levels up to around 10 mV at RF frequencies. It should preferably have a bandwidth adequate to produce an output value in less than the time it takes for controller 124 to set up selector 108, typically around 1 msec. A low noise, high bandwidth operational amplifier as typically used in standard AM radio technology is adequate.

As used in this disclosure, the term "RF frequencies" is not intended to refer to a specific frequency range, but instead to a concept known to those skilled in the art. Effective embodiments employing the principles of this invention may be constructed to operate at other frequencies as well.

Output 110C is connected to ground, which here is the reference voltage for PCB 100 and is not necessarily the reference voltage for any analog signals used for testing.

Receiver 114 is coupled to selected outputs 110 through capacitors 116A and 116B. The inputs of receiver 114 are coupled to the same outputs 110 as are DC bias sources 112A and 112B. However, capacitors 116A and 116B block DC signals from DC bias sources 112A and 112B from reaching receiver 114 but allow RF signals to pass.

An antenna 104 is placed over PCB 100. Antenna 104 is preferably configured to radiate an RF signal with a magnetic field component parallel to PCB 100. Antenna 104 should not be in direct electrical contact with PCB 100 or IC chips 102. However, antenna 104 may be close to IC chips 102 and, if insulation is provided, may rest on them.

A ground plane 126 may be mounted behind antenna 104. Ground plane 126 reduces the far field radiation pattern generated by antenna 104. The spacing between ground plane 126 and antenna 104 is selected to be large enough that sufficient signal radiates into chips 102 but small enough that excessive energy does not radiate into the traces on PCB 100. In a preferred embodiment, the spacing between ground plane 126 and antenna 104 is about 60 mils.

Figure 2:
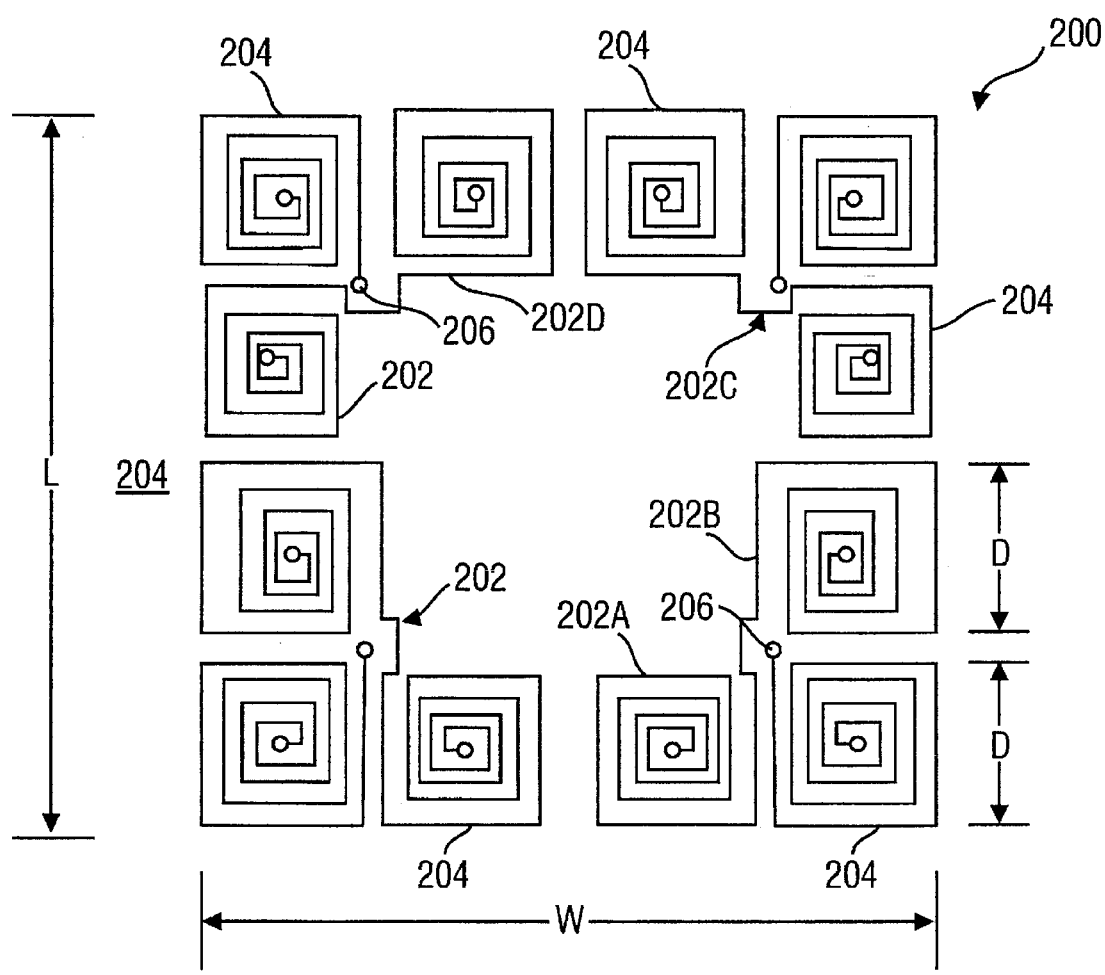
FIG. 2 is a plan view of a preferred embodiment of the antenna array.

Antenna 104 is driven by an RF analog source 122. In a preferred embodiment, antenna 104 is an array antenna made up of a two dimensional array of elements (FIG. 2). Analog source 122 is connected to the individual antenna elements via antenna selector 118. Antenna selector 118 may be a bank of analog switches allowing the source 122 to be connected to various antenna elements. When testing for open circuit faults involving a lead of a specific IC 102, it is only necessary that antenna elements located above that IC be powered by RF analog source 122. It is usually preferable that antenna elements located above other ICs not be powered to reduce stray signals on PCB 100. Accordingly, antenna selector 118 preferably connects RF analog source 122 to selected groups of antenna elements above the IC being tested.

Antenna 104 may be an array of antenna elements that fully cover the entire area of PCB 100. Such an antenna could be used to test any printed circuit board but requires antenna selector 118 to connect to many antenna elements. Alternatively, antenna 104 may be made up of clusters of antenna elements positioned to test a particular PC board, with each cluster positioned above one IC 102. As all of the elements in each cluster are powered by RF source 122 at the same time, antenna selector 118 is simplified, but the clusters of antenna elements must be positioned differently when different printed circuit boards are tested.

Antenna 104 is mounted in any convenient manner. Fixtures in board testers often employ a device called an "over clamp" (not shown). The over clamp is located above the PCB being tested and provides a convenient mounting point for antenna 104. Optionally, compliant spacers (not shown) may be inserted between antenna 104 and the over clamp to facilitate close mounting of antenna 104 to PCB 100 without imposing strict manufacturing tolerances. Foam rubber or other compliant material may be used to make the compliant spacers. If antenna 104 is implemented as clusters of antenna elements, each of the clusters may be mounted to the over clamp separately using compliant spacers.

RF analog frequency source 122 is implemented using conventional hardware such as is used in AM radio systems. RF analog source preferably delivers at least 100 mW into 50 ohms. The signal provided by RF source 122 preferably has a frequency in the range of 1 to 2 MHz, with 1.6 MHz being most preferred in present embodiments. This range of frequencies represents a compromise found to be adequate for most PCBs. For frequencies below the preferred range, too much signal is coupled to all traces on the PCB, making accurate measurement of the signal provided by a particular lead difficult. Selector 108 may not accurately handle signals above 2 MHz because of cross talk between channels. However, the choice of frequencies and signal levels is not critical to the invention and is dictated by practical implementation details that can be resolved as matters of design choice. Lower frequencies would give better results for testing PCBs that are shielded. On the other hand, higher frequency signals would give better results if selector 108 had a higher bandwidth or in embodiments where RF signals are detected on PCB 100 without passing through a selector.

Antenna selector 118 may be implemented using conventional RF switching circuitry. A simple implementation would comprise a bank of diodes. Each diode has one end coupled to RF source 122. The output of each of the diodes runs to a different antenna element or antenna cluster that is to be selected. Connection is made between RF source 122 and the selected antenna element by forward biasing the diode connecting the source to that element. Thus the control inputs to antenna selector 118 are signals which forward bias selected diodes. The DC signal needed to forward bias the diode may be filtered out by a blocking capacitor.

The output of receiver 114, the control input to selector 108 and the control input of antenna selector 118 are connected to controller 124. Controller 124 preferably comprises a microprocessor or other computing element programmed to execute a test sequence as hereinafter described.

The printed circuit board tester of the invention is intended to be used in conjunction with a bed-of-nails circuit board tester of the type known in the art. Bed-of-nails 106, selector 108, DC bias sources 112A and 112B, controller 124 are all parts commonly found in a bed-of-nails type circuit board tester. In addition, bed-of-nails testers conventionally contain channels that can generate DC bias signals under computer control and that can receive signals such that control connections to antenna selector 118 could be easily implemented and the output of receiver 114 could be easily connected to the controller in the tester. An example of one suitable printed circuit board tester is the Teradyne model Z1800 board test system.

To improve noise immunity, it is preferable that the RF components such as RF source 122 and receiver 114 be located in a separate electrical enclosure shielded from the other components in the board test system. To reduce the complexity of connections, antenna selector 118 could be built into the fixture which holds PCB 100 and antenna 104. Connection between the RF source 122 and antenna selector 118 could conveniently be made by a shielded 50 ohm cable with a quick disconnect plug. Standard design practices may be used to select cables for other RF connections.

Turning now to FIG. 2, a cluster of antenna elements 200 in antenna 104 is shown in greater detail. Here, an array of spiral antenna elements 202 and 204 is used. The antenna elements 202 and 204 are manufactured by printing conductive traces on a dielectric board in the same way that traces are manufactured on a printed circuit board.

Figure 5:
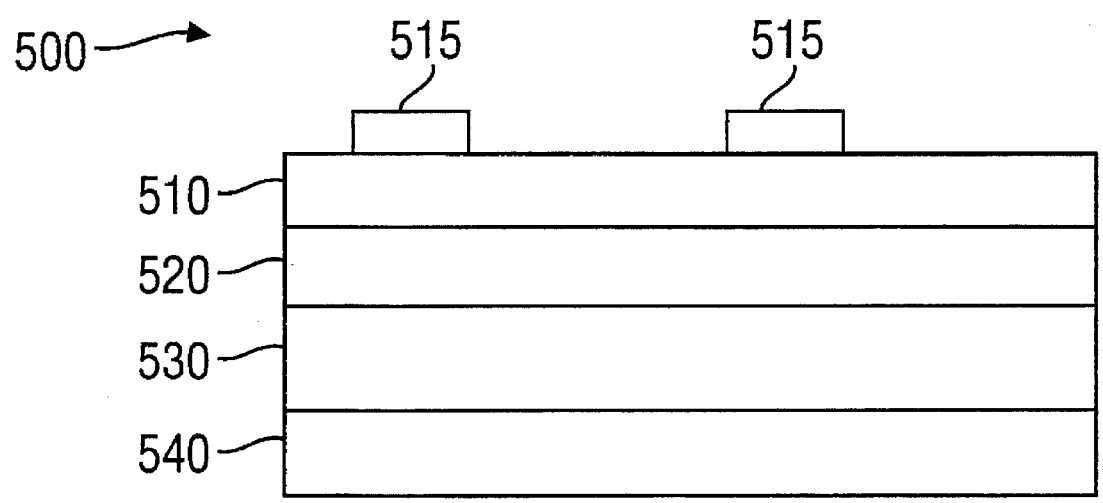
FIG. 5 is a cross-sectional view showing a printed circuit board used in the present invention.

In a presently preferred embodiment, a four layer printed circuit board 500 is used, as shown in FIG. 5. On the top layer 510 connection pads are printed such that signal connections may be made to the antenna. As will be described below, the signals supplied to some of the antennas may be phase shifted. Capacitive elements 515 employed to cause a phase shift may also be connected to the top layer. The second layer 530 contains a virtually solid conductor which is connected to ground and serves as ground plane 126 (FIG. 1). The third layer 520 contains traces used to interconnect spiral antenna elements 202 and 204. The fourth layer 540 contains the illustrated antenna elements. All four layers are connected together by means of via holes 206, which are well known in the printed circuit board art.

The fourth layer contains the spiral antenna elements 202 and 204, which are disposed in a pattern with dimensions W×L. These dimensions are chosen to roughly match the dimensions of the IC 102 (FIG. 1) over which cluster 200 will be mounted. Each spiral antenna element 202 and 204 has a diameter D of approximately one quarter of an inch. This dimension may be selected to control the depth the radiated magnetic field penetrates into PCB 100. Smaller dimensions result in less penetration.

In preferred embodiments, it is desirable for adjacent antenna elements to have a phase advanced 90 degrees and for each cluster 200 to contain a number of antenna elements that is a multiple of four. The cluster shown in FIG. 2 contains 12 antenna elements. In this way, the near field magnetic field parallel to PCB 100 (FIG. 1) may be maximized, and the far field radiation may be minimized, because four elements, each 90 degrees out of phase, will cancel in the far field. The near field radiation that is produced by the described structure is sufficient to induce a measurable voltage on PCB 100, whereas the far field radiation, which could create spurious signals or noise, is minimized.

To provide the desired phase difference between antenna elements, the antenna elements are divided into two groups, with every other antenna element being in the same group. The first group contains antenna elements 202 and the second group contains antenna elements 204. The first group of antenna elements 202 is connected directly to the signal from signal source 122 (FIG. 1). The second group of antenna elements 204 is connected to the signal source through a capacitive phase shift network which introduces a 90 degree phase shift.

To ensure that each spiral antenna element advances in phase by 90 degrees, adjacent spiral elements in each group must be out of phase by 180 degrees. A 180 degree phase shift between adjacent elements in a group is provided by appropriately interconnecting the antenna elements in each group.

There are two techniques used to ensure the currents have the appropriate phase relationship. Adjacent elements could have their outermost traces interconnected in the fashion of elements 202A and 202B. With this interconnection, a current flows in the opposite direction (i.e. 180 degrees out of phase) in spirals 202A and 202B. Alternatively, adjacent spiral antenna elements could have a 180 degree phase difference if they are wound in opposite directions. For example, spiral antenna element 202C is a counter clockwise spiral while its adjacent spiral antenna element 202D is a clockwise spiral.

The antenna elements 204 in the second group have the same phase relationship as the antenna elements in the first group but are fed by a signal which is 90 degrees out of phase with the signal used to feed the first group of antenna elements. The same techniques are used to provide the 180 degree phase difference between adjacent elements 204 in the second group. The signal with a 90 degree phase shift is provided by passing the signal from signal source 122 (FIG. 1) through a capacitive network as is well known in the art (not shown).

Figure 3:
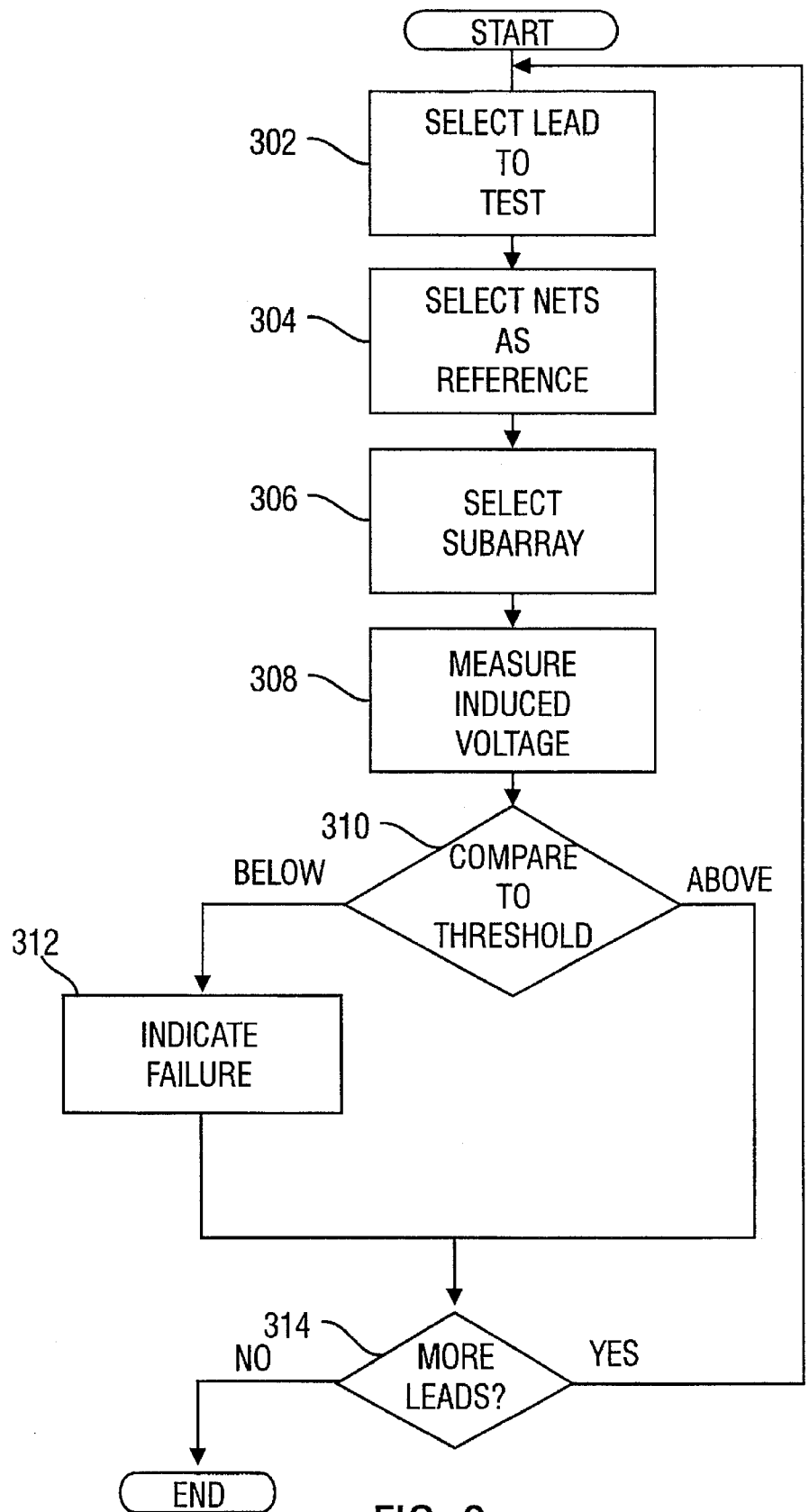
FIG. 3 is a flow chart showing a test method according to the present invention.

FIG. 3 shows a flow chart of a test program such as would be implemented by controller 124 in a preferred embodiment. At step 302, one lead of one of the IC chips 102 is selected for testing. As is conventional in a bed-of-nails tester, a test engineer knows the design of the printed circuit board being tested and also the placement of the bed-of-nails contact pins in relation to the leads of the integrated circuits on PCB 100. To implement the selection, controller 124 sends a control signal to selector 108 to connect a selected pin 106 to the positive input of receiver 114. The selected pin is one which contacts a circuit board trace to which the lead under test is intended to be connected.

In step 304, controller 124 selects one of the pins 106 to provide a reference signal. A printed circuit board usually contains numerous traces which are interconnected into separate networks. The pin 106 selected for the reference may be any pin connected to a different network than the lead selected at step 302.

At step 306, controller 124 sends control signals to antenna selector 118. In response to these control signals, antenna selector 118 connects RF analog source 122 to a subarray of elements in antenna 104. The subarray is selected to be a cluster above the IC chip 102 that is selected for testing. The subarray preferably contains a multiple of four adjacent antenna elements. As described above, adjacent antenna elements are driven by a signal which is phase shifted by 90 degrees for each adjacent element. The superposition of the signals will create a magnetic field which drops to zero in the far field. However, in the near field, the magnetic field will preferably have no "dead spots" under the subarray.

In step 308, the output of receiver 114 is sensed by controller 124. To measure the RF signal induced in the IC being tested, it is necessary that RF analog source 122 and DC bias sources 112A and 112B be turned on. It is also necessary that output 110C, which establishes circuit board ground, be connected, preferably through a pin in the bed-of-nails fixture, to a network on PCB 100 that is connected to ground. This RF signal measurement reflects the difference in voltage that has been induced in two conducting loops which include connections between component leads and PCB 100.

Figure 4:
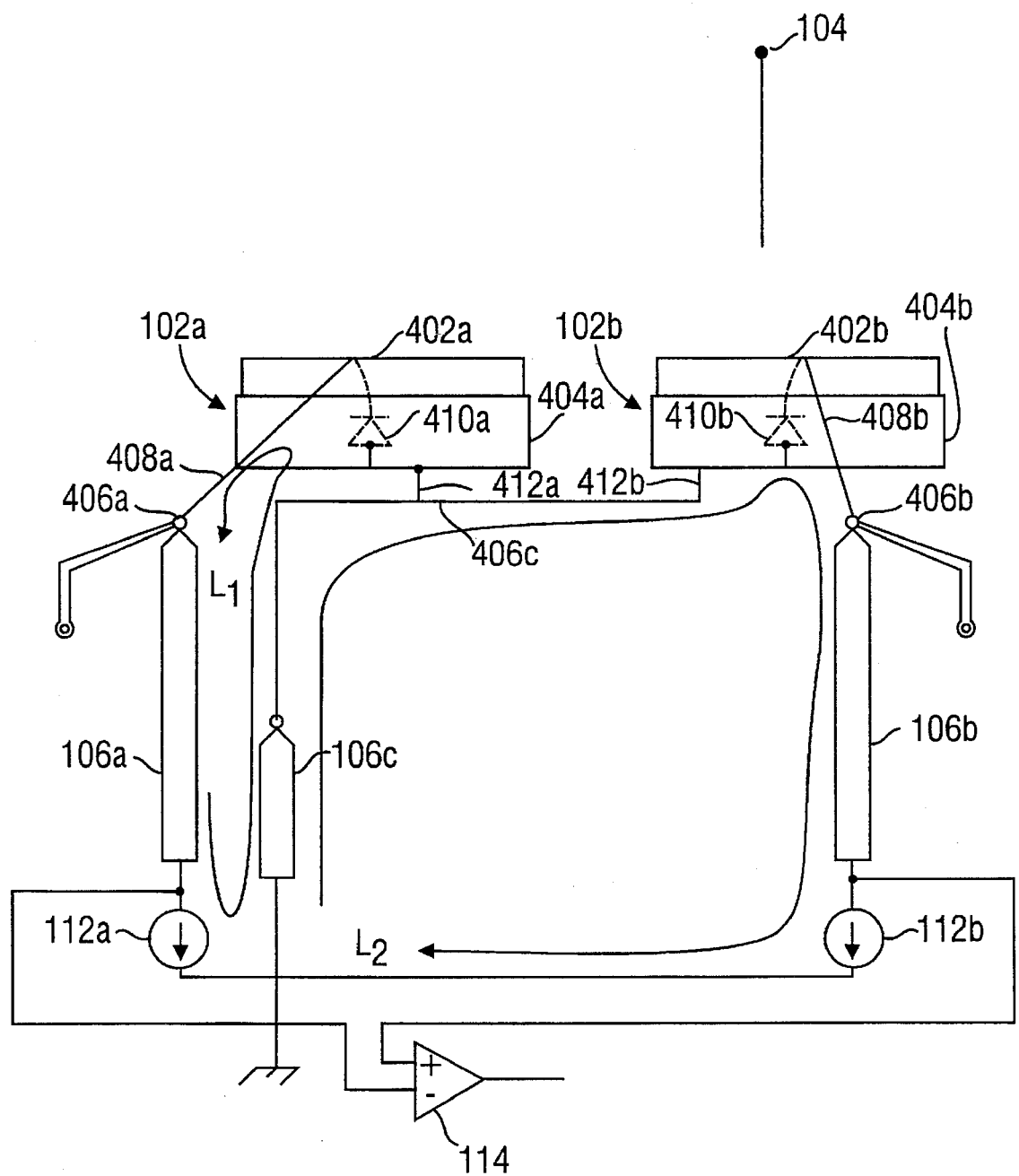
FIG. 4 is a simplified schematic illustrating the principal of operation of the invention.

The principal of operation of this invention is more clearly illustrated in FIG. 4, which shows the conducting loops that are formed by forward biasing the parasitic diodes. Through connections made by selector 108 and pins 106, one loop, L2, includes DC bias source 112B which is connected to tester ground. Loop L2 is completed by structures positioned on PCB 100. The portion of the loop on PCB 100 consists of conductive trace 406B connected to one of the pins 106B, lead 408B of chip 102B being tested, and parasitic diode 410B which inherently forms in substrate 404B of chip 102B and connects every lead of chip 102B to ground trace 406C on PCB 100 through the ground lead 412B on chip 102B. As the ground trace is connected through pin 106C to the tester ground, the loop is completed.

However, a voltage will only be induced in this loop if it is a conducting loop. To be conducting, all the elements in the loop must electrically connected, i.e. there can be no opens. In addition, parasitic diode 410B must be forward biased. DC bias source 112B forward biases parasitic diode 410B. Therefore, if all the elements in loop L2 are connected, the magnetic field radiated by antenna 104 will cut through a conductive loop. As is well known, an RF field cutting through a conductive loop induces a voltage in that loop. On the other hand, if lead 408B is not connected to trace 406B, loop L2 will not be conductive for two reasons. First, the faulty connection itself breaks the loop. Second, the open circuit prevents DC bias current from flowing, such that parasitic diode 410B is not forward biased and does not conduct.

The fact that there are two possible reasons why the loop may not be conducting is very beneficial in detecting some types of faults. For example, a small break in a conductive path can act as a small capacitor and appear as a conductor to an RF signal. As an RF signal can pass through a capacitor, loop L2 might still be conductive at RF frequencies even if small breaks were present. As a result, some faults might not be detected in approaches relying solely on capacitive coupling or on RF stimulation. However, because the invention requires the formation of a conductive loop through the parasitic diode, and there must be a DC bias current flowing in the loop for it to be conductive, even small defects will prevent the formation of a conductive loop and produce a large change in the induced voltage.

Loop L1 is very similar to loop L2 and it acts as a reference loop. Loop L1 includes DC bias source 112A which forward biases a parasitic diode 410A on a chip 102A which is connected to a trace on PCB 100 through lead 408A. Chip 102A is selected to be spaced apart from chip 102B being tested and therefore from the portion of antenna 104 which is radiating. The voltage induced in loop L1 reflects the level of voltage induced in a conducting loop as a result of stray electromagnetic signals. Thus, it is provided to receiver 114 as a reference signal and it at least partially cancels out the effect of any voltage in loop L2 induced by stray signals.

In FIG. 4, only two chips and only segments of the traces on PCB 100 are shown for simplicity of explanation. This invention allows testing of commercial printed circuit boards, which typically have many more components. The small number of components and traces are intended to aid illustration of the operative principle rather than to limit the scope of the invention.

Returning now to FIG. 3, the next step in the testing method is comparison step 310. In this step, controller 124 (FIG. 1) compares the induced voltage measured by receiver 114 to a threshold. If the voltage is above the threshold, there is a high degree of confidence that the lead selected for testing in step 302 is appropriately connected to PCB 100. Accordingly, program execution continues at step 314. Conversely, if the measured voltage is below the threshold, there is a failure and program execution continues at step 312.

The actual voltage level selected as the threshold depends on many factors such as voltage level of source 122, the spacing of antennas 104 from PCB 100, the frequency of source 122, the sensitivity of receiver 114, and the specific design of the printed circuit board under test. Accordingly, the desired threshold is determined as a matter of design choice by measuring the voltage level on boards which are known to be correctly assembled. In presently preferred embodiments, a threshold of approximately 50 μV is used.

At step 312, the information that a failure has occurred is processed. When the received voltage is below the threshold, the most likely cause is that the lead selected for testing is not properly connected to PCB 100. In its simplest form, step 312 may simply store into a computer file information indicating which lead is faulty. This file can be read by a human operator and used to fix the faulty board. More elaborate forms of failure processing can alternatively be performed. For example, a picture of PCB 100 can be displayed on a computer screen with locations of failures highlighted. The method of processing and displaying failure information is not critical to the invention and any convenient method may be used.

Program execution continues at step 314. At step 314, it is determined if more leads remain to be tested. When all leads have been tested, the program ends. Where more leads are to be tested, the program loops back to step 302 where another lead is tested. The order in which leads are tested is not critical to the invention. However, antenna selector 118 will likely switch faster than selector 108. Faster test times will result if selector 108 is configured to make connection to one net of conductive traces on PCB 100 and all IC leads connected to that network are tested by changing the control inputs to antenna selector 118.

Having described presently preferred embodiments of the invention, a person of skill in the art would recognize that various alternative embodiments could be constructed within the scope of the invention. For example, it has been found that the received signal strength depends on the level of the DC bias current. Current sources 112A and 112B may be made variable in order to provide more control over the testing process.

Also, RF analog source 122 was described as being a fixed frequency source. However, greater penetration of the signal into IC chips 102 can be obtained with a lower frequency source. Where IC chips 102 contain ground plates above the chip, shielding or thick packages, it may be desirable to use a lower frequency source. Optionally, RF analog source 122 could be a variable frequency source that could be adjusted by controller 124 depending on the type of board or component being tested.

It was described that antenna 104 is stationary and a signal is applied to IC chips at various locations on PCB 100 by selecting subarrays at those various locations. The same effect could be achieved by having a small antenna array and physically moving it above PCB 100. Alternatively, all parts of the antenna array could be energized simultaneously. However, such an arrangement would draw more power and generate more potentially interfering signals, and there would be a greater likelihood of a false signal being detected by receiver 114.

FIG. 2 shows that all the elements of antenna 104 are disposed on one layer of a PCB. The antennas could be disposed on multiple layers and in some instances such an arrangement would be desirable. If the antenna elements were disposed on multiple layers, the spacing between antenna elements could be reduced to the point that adjacent antenna elements actually overlap. Very close spacing of antenna elements makes a more uniform magnetic field and can also reduce the magnitude of the far field radiation generated by the antenna.

Further, it was described that contact was made to the printed circuit board being tested through a bed-of-nails tester. Any means of sensing the induced signal may be used. For example, it was described above that RF signals above 2 MHz are not desirable. For such high frequency signals, the induced currents on the PCB can cause reradiation, especially in selector 108 and bed-of-nails 106. However, the reradiation of the induced signal could be measured as an indication of the signal induced on the PCB. To measure the reradiated signal, a receive antenna would be placed near PCB 100. Such an arrangement would allow use of higher frequency signals which would induce a greater voltage on the PCB. The receive antenna could be placed above or below PCB 100. If the receive antenna were placed on the same side of PCB 100 as antenna 104, it would have to be separated from it either physically or electrically. It could be physically separated from it to measure reradiation induced in a portion of the loop on the PCB which is spaced apart from the chip 102 being tested. The receiving antenna could be electrically separated from the transmitting antenna by being adapted to detect a signal having a different polarity. Electrical isolation techniques could also be used to separate the transmit and receive antennas. For example, the coupling between the transmit and receive antennas could be determined and the coupled signal could be subtracted from the received signal to generate a signal representative of the reradiated signal. Of course, where electrical isolation is used between the transmit and receive antennas, it would be possible to place the antennas very close together or to even use the same antenna to both transmit and receive.

Other means for detecting whether a voltage has been induced in the loop established on the printed circuit board might also be used. In place of a receive antenna, other types of sensors which detect magnetic or electric fields could be used.

In the preferred embodiments described herein, the invention is used for detecting faults in the connections on a printed circuit board. The invention may also be used to test any sort of electrical components with interconnects, including multiwire boards, multichip modules, or hybrid components. It was further described that loops may be established on the PCB by forward biasing parasitic diodes in IC chips. Other means of establishing a loop can be employed. For example, components could be modified to include diodes to facilitate testing. Alternatively, the loop could be completed by taking advantage of parasitic transistors or other circuit features.

Further modifications and alternative embodiments of this invention will be apparent to those skilled in the art in view of this description. Accordingly, this description is to be construed as illustrative only and is for the purpose of teaching those skilled in the art the manner of carrying out the invention. It is to be understood that the forms of the invention herein shown and described are to be taken as the presently preferred embodiments. Various changes may be made in the shape, size, and arrangement of parts. For example, equivalent elements or materials may be substituted for those illustrated and described herein, and certain features of the invention may be utilized independently of the use of other features, all as would be apparent to one skilled in the art after having the benefit of this description of the invention.

What is claimed is:

1. Apparatus for testing a populated printed circuit board for faults comprising:
    a fixture having a plurality of conductive members adapted to make contact to a printed circuit board positioned in the fixture;
    an antenna mounted near the fixture;
    a bias source connected to one of the plurality of conductive members; and
    a receiver connected to the bias source.

2. The apparatus of claim 1 wherein the fixture comprises a bed-of-nails fixture.

3. The apparatus of claim 1 wherein the antenna comprises a plurality of antenna elements.

4. The apparatus of claim 3, additionally comprising:
    a signal source for generating an RF signal; and
    a switching network switchably connecting the signal source to each of the antenna elements.

5. The apparatus of claim 4 additionally comprising means for shifting the phase of the RF signal applied to adjacent antenna elements by 90 degrees.

6. The apparatus of claim 1 additionally comprising a ground plane positioned above the antenna.

7. The apparatus of claim 1 additionally comprising a variable frequency signal source coupled to the antenna.

8. The apparatus of claim 1, additionally comprising:
    a second bias source connected to one of the plurality of conductive members, and wherein the receiver is a differential receiver having two inputs, its second input being connected to the second bias source.

9. The apparatus of claim 8 wherein the receiver is capacitively coupled to the bias source and the second bias source.

10. The apparatus of claim 1, further comprising a controller connected to the fixture and to the receiver, the controller storing a threshold for comparison to the output of the receiver, the controller also including means for comparing the output of the receiver to the threshold.

11. Apparatus for testing a populated printed circuit board for faults, comprising:
    a fixture having a plurality of conductive members adapted to make electrical contact with conductive traces on a printed circuit board;
    a radiating antenna positioned near the fixture;
    a bias source connected to one of the conductive members;
    means for measuring a signal induced in the printed circuit board by a magnetic field created by the radiating antenna, said means for measuring being electrically coupled to at least one of the conductive traces on the printed circuit board.

12. Apparatus for testing a printed circuit board for open circuit defects, the printed circuit board having electronic circuits mounted thereon which include inherent parasitic diodes, comprising:
    a bed-of-nails fixture having a plurality of conductive pins;
    an array antenna comprising a plurality of antenna elements adapted to radiate energy toward the fixture;
    a signal source connected to the array antenna;
    means for connecting the signal source to selected ones of the antenna elements;
    a DC bias source connected to one of the plurality of conductive pins for producing a bias current sufficient to forward bias the parasitic diodes; and
    a receiver connected to the DC bias source.

13. The apparatus of claim 12 additionally comprising means for phase shifting the signal provided to selected ones of the antenna elements.

14. The apparatus of claim 12 additionally comprising a ground plane mounted above the antenna.

15. The apparatus of claim 12 wherein the signal source is a variable frequency source.

16. The apparatus of claim 12 wherein each of the antenna elements is a spiral antenna.

17. The apparatus of claim 12 wherein the receiver is synchronized to the signal source.

18. A method for testing a populated printed circuit board for open circuit faults comprising the steps of:

establishing a loop on the printed circuit board including a selected integrated circuit chip that is mounted on the printed circuit board;

radiating an alternating magnetic field toward the selected integrated circuit chip;

detecting the voltage induced in the loop; and indicating that the selected integrated circuit chip is not properly connected to the printed circuit board when the detected voltage is below a selected threshold voltage.

19. The method of claim 18 wherein the step of establishing a loop comprises:

mounting the printed circuit board in a bed-of-nails fixture;

connecting selected ones of the nails in the bed-of-nails fixture to a current source; and supplying a bias signal to the printed circuit board of sufficient magnitude to forward bias a parasitic diode in the selected integrated circuit chip.

20. The method of claim 18 wherein the step of radiating comprises coupling an alternating electrical signal to selected elements in an antenna array thereby radiating a magnetic field from said antenna array.

21. The method of claim 18 additionally comprising the step of indicating a failure when the measured voltage is below a threshold of 50 µV.

22. The method of claim 18 wherein the step of measuring the induced voltage comprises taking a differential measurement of the voltage in the loop and the voltage in a second loop distinct from the loop containing the selected integrated circuit.

23. The method of claim 18 wherein the step of measuring the induced voltage comprising receiving a signal reradiated from the printed circuit board.

24. An apparatus for testing a printed circuit board upon which electronic components are mounted to detect faulty connections between a lead of a selected component and conductive traces on the printed circuit board, comprising:

means for forming a loop on the printed circuit board, said loop including said lead of said selected component;

means for generating an alternating magnetic field that intersects the loop; and means for detecting a signal induced by said alternating magnetic field in the loop.

25. The apparatus of claim 24, further comprising a fault indicator coupled to the detecting means for indicating the presence of a faulty connection between the component and the printed circuit board based on a comparison of the detected signal with a reference signal.

26. The apparatus of claim 24, further comprising a bed-of-nails fixture.

27. The apparatus of claim 24, wherein said generating means includes an antenna array.

28. The apparatus of claim 27, wherein said antenna array comprises a plurality of spiral loop antennas.

29. The apparatus of claim 28, each of said spiral loop antennas in said antenna array being adjacent to at least one other spiral loop antenna of said antenna array, each of said spiral loop antennas being adapted to generate a magnetic field that is 90 degrees out of phase with a magnetic field generated by an adjacent spiral loop antenna.

* * * * *